(12) United States Patent
Reeves

(10) Patent No.: US 11,493,319 B2
(45) Date of Patent: Nov. 8, 2022

(54) ELECTROMAGNETIC MULTIFUNCTION INSPECTION APPARATUS

(71) Applicant: Roger Dale Reeves, Cairo (EG)

(72) Inventor: Roger Dale Reeves, Cairo (EG)

( * ) Notice: Subject to any disclaimer, the term of this patent is extended or adjusted under 35 U.S.C. 154(b) by 142 days.

(21) Appl. No.: 17/197,529

(22) Filed: Mar. 10, 2021

(65) Prior Publication Data

US 2022/0290967 A1    Sep. 15, 2022

(51) Int. Cl.
*G01R 33/07* (2006.01)
*G01B 7/06* (2006.01)
*G01N 29/27* (2006.01)

(52) U.S. Cl.
CPC .............. *G01B 7/105* (2013.01); *G01N 29/27* (2013.01); *G01R 33/07* (2013.01)

(58) Field of Classification Search
CPC ......... G01B 7/105; G01N 29/27; G01R 33/07
USPC ....................................................... 324/221
See application file for complete search history.

(56) References Cited

U.S. PATENT DOCUMENTS

| | | |
|---|---|---|
| 4,096,437 A | 6/1978 | Kitzinger |
| 4,101,832 A | 7/1978 | Baker |
| 4,379,261 A * | 4/1983 | Lakin .................. G01N 27/904 324/240 |
| 4,492,115 A | 1/1985 | Kahil |
| 5,377,553 A | 1/1995 | Knepper, Jr. |
| 5,431,054 A | 7/1995 | Reeves |
| 5,442,278 A | 8/1995 | Fan Chiang |
| 5,600,069 A | 2/1997 | Girndt |
| 5,793,205 A | 8/1998 | Griffith |
| 6,249,119 B1 | 6/2001 | Curtis |
| 6,271,670 B1 | 8/2001 | Caffey |
| 6,288,535 B1 * | 9/2001 | Chass ................... G01D 5/147 324/207.2 |
| 6,924,640 B2 | 8/2005 | Fickert |
| 7,397,238 B2 | 7/2008 | Walters |
| 8,089,273 B2 | 1/2012 | Hoyt |
| 8,134,360 B2 | 3/2012 | Dutta |

(Continued)

FOREIGN PATENT DOCUMENTS

| | | |
|---|---|---|
| CA | 2747053 C | 7/2010 |
| CA | 2941509 C | 12/2010 |

OTHER PUBLICATIONS

International Search Report and Written Opinion of the International Searching Authority for corresponding PCT/US2022/017474, dated Jun. 28, 2022.

*Primary Examiner* — Tung X Nguyen
*Assistant Examiner* — Robert P Alejnikov, Jr.
(74) *Attorney, Agent, or Firm* — Egbert, McDaniel & Swartz, PLLC

(57) ABSTRACT

A flaw detection apparatus for use with a tubular has a helixing conveyor adapted to receive the tubular thereon, a frame positioned over a center section of the helixing conveyor, and a plurality of inspection devices retained by the frame so as to detect flaws in the tubular as said helixing conveyor moves the tubular through the frame. The helixing conveyor has a plurality of sets of rollers that are angularly adjustable relative to a longitudinal axis of the helixing conveyor. The plurality of inspection devices include a longitudinal inspection device, a Hall Effect wall thickness inspection device, an oblique inspection device, a transverse inspection device, and a grade verification/comparator device.

14 Claims, 9 Drawing Sheets

(56) References Cited

U.S. PATENT DOCUMENTS

| | | | |
|---|---|---|---|
| 8,575,923 B1* | 11/2013 | Thompson | G01N 27/82 324/216 |
| 9,030,195 B2* | 5/2015 | Gies | G01N 27/902 324/240 |
| 2002/0069704 A1 | 6/2002 | Robb | |
| 2003/0011363 A1* | 1/2003 | Wayman | G01N 27/82 324/238 |
| 2006/0164091 A1 | 7/2006 | Nestleroth | |
| 2007/0222438 A1* | 9/2007 | Reeves | G01N 27/82 324/228 |
| 2009/0132181 A1* | 5/2009 | Girndt | G01N 27/902 702/39 |
| 2010/0126278 A1* | 5/2010 | Kubota | G01N 29/265 702/39 |
| 2015/0107512 A1 | 4/2015 | Taylor et al. | |
| 2018/0196005 A1 | 7/2018 | Fanini et al. | |

* cited by examiner

ELECTROMAGNETIC MULTIFUNCTION INSPECTION APPARATUS

CROSS-REFERENCE TO RELATED APPLICATIONS

Not applicable.

BACKGROUND OF THE INVENTION

1. Field of the Invention

The present invention relates to the inspection of tubulars. More particularly, the present invention relates to apparatus for detecting flaws in a tubular. Additionally, the present invention relates to apparatus whereby a fixed frame contains the electromagnetic flux generators and sensors relative to a tubular that is translatably passed therethrough.

2. Description of Related Art Including Information Disclosed Under 37 CFR 1.97 and 37 CFR 1.98

Continuous tubular strings formed of connectable tubular sections or elements, such as production tubing strings, strings of drill pipe and casing strings, are used in the drilling, completion and production of subterranean oil and gas wells. The tubular elements comprising such strings are subject to mechanical damage when the tubular elements are located within the well and are also subject to the action of corrosive fluids which may be contained within the tubular elements or which may be transported through the tubular string between the well surface and a downhole location. It is therefore advantageous that the individual tubular elements comprising a tubular string be inspected periodically. Commonly, tubular elements or tubular sections are inspected for defects after the tubing string is removed from the well or on new manufactured tubular sections prior to first use in a well. Conventional inspection of tubular sections normally occurs to the individual tubing sections comprising the tubing string. Defect inspections are conventionally performed on a section-by-section basis.

A number of techniques exist for determining the presence of a defect in a tubing section. For example, the precise location of internal and external radially extending and three-dimensional defects, including slug inclusions, mechanical damage, corrosion pitting and fatigue cracks, has been determined by flux leakage techniques in which a longitudinal magnetic field is induced by one or more magnetic induction coils. Surface riding detectors are located around the tubing and the maximum signal is recorded to precisely locate the defect.

A common way of detecting longitudinal defects magnetically is the "rotating pole" method, where the magnetic field is applied from the outside by rotating electromagnets and where detectors positioned in-between the poles scan the outside surface of the pipe. Tubing wall thickness has been measured by measuring the radiation from an external rotating radioactive source of gamma radiation transmitted through the wall of a tubing section to a detector positioned inside the pipe. Other ways of measuring wall thickness with gamma radiation, which are backscatter, double-wall through-transmission and chord, have both the radiation detector and the source located on the outside of the pipe.

One technique for inspecting tubular elements which is adaptable to relative movement, at variable velocities, is a technique involving the use of a saturating longitudinal magnetic field and the subsequent measurement of the time integral of the electrical signal caused by the magnetic field applied to the ferromagnetic tubular member to determine the average wall thickness. Testing using this technique has been conducted for surface pipe installations in which the magnetic field and the flux detecting elements are moved relative to a continuous pipe array.

Typically, the electromagnetic inspection system uses sensors to detect magnetic flux leakage which occurs when a discontinuity is present in the tubular wall section. Conventionally, the sensors rotate around the tubular in a fixed rotating housing as the tubular is conveyed linearly through the rotating housing by a conventional conveying means. The rotating sensors maintain contact with the surface of the tubular during inspection activities. The magnetic field is introduced into the tubular by electromagnets contained in the rotating detector housing or by a residual magnetic field magnetizing means prior to the tubular entering the rotating detector assembly. The use of electromagnets attached within the rotating detection housing requires the use of slip rings and brushes to convey the electrical power to the electromagnets that are located 180° apart in the rotating housing. The electromagnets are positioned 90° from each of the two sensors which are positioned opposite to each other in the rotating detection housings. The electromagnets are mounted within the rotating assembly at a fixed distance from the tubular outside diameter surface. Metal shim plates are attached to the electromagnets in order to adjust the electromagnet's pole face into close proximity with the tubular outside diameter surface. These metal shim plates will vary in thickness in order that the shim plate pole face will be in close proximity to the tubular outside surface in order that a sufficient magnetic field for inspection detector sensitivity is introduced into the tubular wall thickness section. The close proximity distance of the electromagnetic shimmed pole face is not sufficient to allow passage of a tubular with large outside diameter upset connections. This is important since tubulars with large upset connections are used extensively in oil and gas drilling operations worldwide. The electromagnets are positioned in such a manner that will cause the resultant magnetic fields generated by each electromagnet to add to the total resultant magnetic field. A total resultant magnetic field is enhanced by aligning the center axis of each of the electromagnetic coils. The total resultant field is further optimized by positioning one electromagnetic coil to produce a north/south magnetic field and positioning the other magnetic coil to produce a south/north magnetic field. The electromagnetic coils do not contact the tubular surface, but are maintained in close proximity to the tubular surface in order to maintain an optimum magnetic field in the tubular wall sections.

The use of the residual circumferential magnetic field applied to each tubular prior to entering the rotating detector assembly eliminates the need for electromagnets in the rotating housing. The residual circumferential magnetic field is induced into the tubular wall by inserting a magnetizing rod through the full length of the internal diameter of the tubular. A cable is attached to each end of the magnetizing rod which is protrudes from each end of the tubular. The cables are attached to a capacitor discharge system or a battery pack discharge unit. Such capacitor discharge systems or battery pack discharge units are commercially available. The capacitor discharge system or battery pack discharge unit is suitably activated. The residual circumferential residual magnetic field that is generated 360° into the tubular wall is utilized for detection of longitudinally-oriented flaws or defects in the test object.

When utilizing either the electromagnets or the residual circumferential magnetic method described above, slip rings are necessary for conveying the signal from the sensors contained within the rotating frame for interpretation by inspection personnel. The use of either the electromagnets or the residual circumferential magnetic methods described hereinabove also requires that the linear tubular conveyer requires that both speed of the conveyor and rotating velocity (rpm) to be controlled and synchronized in order that the resultant helical path of the sensors provides 100% or more of inspection coverage. Also, the use of the electromagnets or the residual method requires the rotating assembly to be balanced by distributing the detectors and/or electromagnets opposite to each other.

Prior art electromagnetic flux leakage tubular inspection equipment utilizes multiple inspection functions with up to four inspection stations. These electromagnetic flux leakage tubular inspection devices are manufactured to inspect various API tubular outside diameter sizes. A typical prior art inspection unit is manufactured to allow inspection of specific outside diameter tubular sizes. Common size ranges of inspection unit designs are 2⅜"-3.5" or 2⅜"-5.5" or 2⅜"-7⅝" or 4.5"-13⅜" or 2⅜"-13⅜". Some units contain only one inspection function, two inspection functions or three inspection functions or all four inspection functions. Multifunction inspection units of the prior art are either single pass where all functions are completed in one forward pass through the unit or double pass where certain functions are performed on the forward pass and other functions are performed of the reverse pass through the unit. Multifunction inspection units in the prior art contain a grade comparator function, a longitudinal inspection function, a wall thickness inspection function and a transverse inspection function. Prior art multifunction electromagnetic flux leakage tubular inspection units convey the tubular linearly through the four functions via a V-roller conveyance system.

A typical four function electromagnetic flux leakage tubular inspection unit is comprised of a rotating inspection head that inspects for longitudinal flaws. The longitudinal inspection function is an inspection apparatus comprised of a mechanically-driven rotating circular frame that contains two electromagnets, detection sensors and a slip ring assembly for electrical power transfer to the electromagnets and the transfer of the signals generated by the longitudinally-oriented flaws from the longitudinal detectors to the electronics processor and chart display in the operator's compartment. The tubular is conveyed linearly through the rotating assembly along the series of V-type rollers on the entry and exit racks section. The tubular does not rotate while conveying through the longitudinal spinning assembly or any of the other inspection assemblies located in the center-section of the unit. A series of V-type pinch roller devices are placed in close proximity to the entry and exit sides of the rotating inspection housing to prevent the electromagnets from grabbing the tubular and to center the tubular in the inspection assembly to allow correct detector ride on the tubular's outer surface as the detector spins around the outside diameter of the tubular. The rotating electromagnetic flux leakage detection sensors are placed at 90° to the electromagnets on opposite sides of the tubular and rotate in constant contact with the outer surface of the tubular as it passes through the longitudinal inspection station. The signal generated by the sensors, when detecting magnetic flux leakage exhibited by the longitudinal flaw, is conveyed to an electronic processor and chart display via rotating slip ring/brushes.

The magnetic section of the rotating inspection assembly accounts for a major capital cost of a conventional electromagnetic multi-function inspection unit. The magnets are not movable and require the installation of metal shims to extend the magnet faces to within close proximity to the outer diameter of the tubular in order to allow the magnetic field to permeate the wall thickness of the tubular. A significant number of tubulars that require an electromagnetic longitudinal inspection will contain couplings or upset ends with the coupling installed on one of the upset ends. Since the upsets and couplings are always larger than the outer diameter of tubular, the magnets and shims are installed at a distance from the outer diameter of the tubular to allow the larger coupling or upset to move through the rotating assembly. The couplings and the upsets are not inspected with the longitudinal inspection assembly due to magnetic end area interference. Doglegged or bent tubulars that may damage the rotating assembly are segregated and are not conveyed through the rotating longitudinal section. Wear of the slip rings or slip ring brushes can cause deterioration of the flaw signal from the rotating assembly to the signal processor. The rotational RPM of the sensors must be adjusted and synchronized to the linear velocity of the tubular to maintain at least 100% inspection coverage.

The longitudinal detectors utilized in prior art rotating longitudinal magnetic flux leakage inspection are either flat on the inspection surface to allow universal use on various sizes or are contoured to the outer diameter of the tubular to fit the tubular along the longitudinal axis of the tubular. As subsequent tubulars enter the rotating detectors and push them open to ride the outside diameter, the elongated detectors can begin to ride the tubular at a slight angle to the longitudinal axis, thus negating the inspection capabilities of the detector sensors in those sections of the detector that do not ride parallel to the longitudinal axis. The longitudinal flaw detection sensors must maintain constant contact with the outer diameter of the tubular to detect magnetic flux leakage from flaws in the tubular. However, due to the centrifugal force exerted on the detection sensors, these longitudinal flaw detection sensors will lift off the detectors as they pass through the bottom arc of the rotation. This will negate the detection for defects and flaws in this section of the circumference of the tubular. Since the view of the detectors inside the rotating head is obstructed by the protective shroud and the outer body of the rotating assembly, the operator cannot visually defect lift-off of the detectors. Therefore, the required periodical re-standardization may not be acceptable due to the detector lift-off. Failure of the re-standardization requires that all of the tubulars inspected since the last acceptable standardization on a test joint must be repeated once the lift-off or damage of the detector is corrected.

Another inspection function is the grade comparator/verification of the tubular passing through the multi-function inspection unit. One type of prior art grade comparator-bridge type, comparator requires placement of one induction coil on a tubular of a known grade, weight/foot and size on a storage rack outside the multi-function inspection unit. A second inspection coil is located on the infeed of the inspection unit. The transfer of the coil measurements that are located in the unit center-section are transferred to the electronics processor and the operator's compartment. The standardization of the grade comparator's electronic display is performed when one of the tubulars that requires inspection is conveyed into the grade coil in the unit and stopped. The grade display "Null" function is adjusted to read "000". Upper and lower alarm limits are then set to display variations from the "000" setting. The pipe is conveyed linearly through both types of grade comparator systems. The pipe is conveyed linearly through the grade comparator systems of the prior art.

A third inspection function is a wall thickness inspection of the tubular passing through the multi-function inspection unit. The prior art utilizes either a rotating head gamma ray wall thickness system or a Hall Effect wall thickness system. The gamma ray systems provide less than 20% coverage of the tubular. In the prior art, the Hall Effect wall thickness sensors are distributed around the circumference of the outside diameter of the tubular. For tubulars having a diameter of 13⅜", the number of sensors required to provide at least 100% inspection coverage would need to extend around the forty-two inch circumference of this 13⅜" outer diameter tubular.

A fourth inspection function is a non-rotating transverse inspection assembly. The tubular passes linearly through the non-rotating transverse inspection assembly located in the center section of the multi-function inspection unit. The prior art utilizes typical types of transverse magnetic flux detection apparatus. The encircling detectors are either mounted midway between two magnetic induction coils or directly under a single magnetic induction coil. Again, the individual non-rotating detectors that are encircling the tubular will detect transversely oriented flaws via the transverse sensors located on each of the detectors. Typically, a demagnification coil is positioned after the transverse inspection assembly to reduce the residual magnetism left in the tubular by the transverse DC coils.

In the past, a variety of patents have issued with respect to the electromagnetic inspection of tubulars and other objects. For example, U.S. Pat. No. 4,096,437, issued on Jun. 20, 1978 to Kitzinger et al., describes a magnetic testing device for detecting loss of metallic area in internal and external defects in elongated objects. The testing device includes a permanent magnet assembly having poles adapted to be spaced apart in the longitudinal direction of the elongated object for inducing a longitudinal magnetic flux in a section of the object between the poles of the magnet assembly. This flux is strong enough to saturate each section of the object. A tubular pole piece is substantially centered on the elongated object adjacent each pole of the permanent magnet assembly for directing the magnetic flux radially into the object at one pole and out of the object at the other pole. Hall effect devices are spaced around at least one pole piece in the path of the magnetic flux for sensing the radial flux entering into the elongated object. Means are provided for sensing the variations of such magnetic flux as an indication of loss of metallic area in the object.

U.S. Pat. No. 4,101,832, issued on Jul. 18, 1978 to Baker et al., provides a multiprobe eddy current flaw detection device having a suitable means for raising and lowering the individual probes. A plurality of pickup arms are mounted in spaced relation with respect to each other around a work path and a plurality of sensing coils are carried by each of the pickup arms. The pickup arms are each mounted on a support member to pivot on an axis transverse to the direction of the work path so that the sensing coils may be moved into proximity and around the circumference of a workpiece as the workpiece travels along the work path.

U.S. Pat. No. 4,379,261, issued on Apr. 5, 1983 to K. M. Lakin, shows a rotating magnetic field device for detecting cracks in metal. This device has input signal coils on cores radially arranged around a center and having outer ends of the cores which rest against a surface of a metal assembly to be tested for defects. The input coils are energized by an AC signal of different phase for each respective coil so that a rotating magnetic field is produced in the assembly being tested. An output sensor coil is mounted at the center of the tester immediately adjacent to such test surface for coupling out a signal induced from the rotating field.

U.S. Pat. No. 4,492,115, issued on Jan. 8, 1985 to Kahil et al., describes a method and apparatus for measuring defects in ferromagnetic tubing. A saturating magnetic field and a fluctuating magnetic field are applied to the tubing. The magnitude of the induced fields and the changes are measured to quantify defects in the tubing. U.S. Pat. No. 4,636,727, issued on Jan. 13, 1987, is another patent by Kahil et al., which describes a similar process for detecting and locating the defects in tubular sections. U.S. Pat. No. 4,710,712, issued on Dec. 1, 1987 to Bradfield et al., also describes a similar system for the use of a saturating magnetic field for the detection of defects in tubing. U.S. Pat. No. 4,792,756, issued on Dec. 20, 1988 to Lam et al., also a slight variation on the previous patents issued to Kahil et al. and to Bradfield et al. U.S. Pat. No. 5,157,977, issued on Oct. 27, 1992 to R. C. Grubbs, teaches an apparatus for feeding, indexing, testing, and storing tubular goods. This machine uses the eddy current test method to test the outer surface, the inner surface, and internal and external threads of the tubular. The pipe is spun during the examination so that the sensors of the inner and outer surfaces, when driven, trace a helical pattern on the pipe.

U.S. Pat. No. 5,377,553, issued on Jan. 3, 1995 to W. H. Knepper, Jr., describes a transducer support device that is employed with magnet flux leak detector so as to render the detector sufficiently compact and lightweight to facilitate the use thereof at the wellhead of an oil well so as to avoid lay-down horizontal inspection at a location away from the wellhead.

U.S. Pat. No. 5,442,278, issued on Aug. 15, 1995 to Kammann et al., teaches a method and apparatus for detecting magnetic discontinuities by inducing a magnetic field into a magnetizable sample. The apparatus includes an electric motor, a transmission, driven transport wheels, and non-driven transport wheels. The apparatus includes a magnetic for inducing a magnetic field in the sample. A sensor unit detects magnetic stray flux from the magnetic field induced in the sample and converts the detected magnetic stray flux into a signal for processing by a signal processor.

U.S. Pat. No. 5,600,069, issued on Feb. 4, 1997 to Girndt et al., provides an ultrasonic testing apparatus and method for multiple diameter oilfield tubulars. The apparatus includes four ultrasonic arrays each containing a plurality of individual watertight ultrasonic transducers. Axially adjustable ultrasonic arrays include axially spaced sockets for controlling an axial movement thereof to discrete positions associated with each selected range of diameters to be tested. During scanning, the tubular is moved axially and rotationally with respect to an ultrasonic testing apparatus to provide a helical scan pattern along the length of the tubular.

U.S. Pat. No. 5,793,205, issued on Aug. 11, 1998 to Griffith et al., describes a coil and guide system for eddy current examination of pipe. This apparatus includes an eddy current coil adapted to removably circumferentially surround the pipe. The coil includes a cable having a plurality of conductors adapted to form a continuous conductor coil when the cable is circumferentially wrapped around the pipe.

U.S. Pat. No. 6,249,119, issued on Jun. 19, 2001 to Curtis et al., teaches a rotating electromagnetic field defect detection system for tubular goods. This system includes an encircling coil for providing a saturating DC magnetic field the to tubular. An encircling drive coil applies a low level AC field using three-phase AC. Encircling pick up coils within the AC drive coils detect uniform, time-varying magnetic fields in order to reveal defects within the tubular passing through the system.

U.S. Pat. No. 6,271,670, issued on Aug. 7, 2001 to T. W. H. Caffey, describes a method and apparatus for detecting external cracks from within a metal tube. A continuous electromagnetic wave from a transverse magnetic-dipole source with a coaxial electric-dipole receiver is used for the detection of the external side wall cracks and other anomalies in boiler tubes.

U.S. Pat. No. 5,431,054, issued on Jul. 11, 1995 to the present inventor, describes an ultrasonic flaw detection device having a transmitting ultrasonic transducer for producing multiple shear wave skips between inner and outer surfaces of a test object, a plurality of receiving transducers positioned ahead of an parallel to at generally the same incident angle as the transmitting ultrasonic transducer, and a processor electrically connected to the receiving transducers so as to produce a humanly perceivable indication of the reflected energy. The receiving transducers serve to receive energy of the shear wave as reflected from the discontinuities in the object. Each of the receiving transducers is electronically isolated from the other receiving transducers. A fixture is provided having a first opening for detachably receiving the transmitting ultrasonic transducer and a plurality of receiving openings receiving the receiving transducers therein.

U.S. Patent Application Serial No. 2007/0222438, published on Sep. 27, 2007 to the present inventor, teaches an electromagnetic flaw detection apparatus for inspection of a tubular. This electromagnetic flaw detection apparatus has a frame, a first electromagnetic field generator connected to the frame, a second electromagnetic field generator connected to the frame on an opposite side of the tubular from the first electromagnetic field generator, first and second sensors positioned with respect to the frame so as to be movable between a first position away from the tubular and a second position in proximity to the tubular, and a tubular conveyor cooperative with the frame for moving the tubular in a helix path along a longitudinal axis of the tubular toward and through the frame. The first and second sensors are suitable for detecting flux leakage from the magnetic flux flow field generated by the electromagnetic field generator.

U.S. Patent Application Publication No. 2006/0164091, published on Jul. 27, 2006 to Nestleroth et al., discloses a rotating magnet-induced current pipeline inspection tool. The apparatus has a configuration of permanent magnets arranged to rotate circumferentially within the pipe such that uniform low-frequency currents are generated within the pipe wall so as to generate fields detectable with conventional Hall Effect sensors.

U.S. Pat. No. 7,397,238, issued on Jul. 8, 2008 to Walters et al., provides a method and apparatus for inspecting materials. This apparatus has a frame that supports a magnetic coil and a detector assembly. The detector assembly has one or more magnetic detectors adapted to be spaced a first distance from the material to be inspected by one or more substantially frictionless members.

Canadian Patent No. 2 747 053, published on Jul. 8, 2010, discloses a magnetic inspection device for nondestructively inspecting elongated objects, such as wire cables, pipes, and the like. This magnetic inspection device has a magnet for inducing in sections of the object between stations a magnetic flux at the saturation level. A magnetic flux detector having magnetic sensors positioned between the poles and laterally of the elongated object utilizes shields and flux decompressors to render the flux detector more sensitive to leakage flux caused by the discontinuities in the objects.

U.S. Pat. No. 8,134,360, issued on Mar. 13, 2012 to Dutta et al., provides a measurement of pipe wall thickness utilizing a magnetic flux leakage signals. This apparatus comprises a processor configured to implement a method of obtaining a pipe profile having a diameter, a nominal thickness, and a material. The magnetic flux leakage is received so as to provide an indication for a pipe associated with the pipe profile. The wall thickness for the pipe utilizes the pipe profile and the magnetic flux leakage indication.

U.S. Pat. No. 6,249,119, issued on Jul. 19, 2001 to Curtis et al., discloses a rotating electromagnetic field defect detection system for tubulars. This defect detection system has an encircling coil for providing a saturating DC magnetic field to the tubular. An encircling drive coil applies a low-level AC field utilizing a three-phase AC power. Encircling pick-up coils within the AC coils detect uniform, time-varying magnetic fields to reveal defects within the tubular goods passing through the system.

U.S. Pat. No. 6,924,640, issued on Aug. 2, 2005 to Fickert, discloses an inspection system for detecting flaws in oil and gas wellbore hole ferromagnetic tubulars. The inspection device operates inside the tubular by first saturating the tubular wall with magnetic flux. Flaws in the wall cause flux leakage. The magnitude of the flux leakage is measured with Hall Effect sensors disposed within the inspection device. The magnitude of flux leakage is then related to the amount of ferromagnetic material loss resulting from the flaw. Eddy currents induced in the wall are also measured and combined with the Hall Effect sensor measurements to define location and geometric shapes of the flaw.

Canadian Patent No. 2 941 509, published on Dec. 26, 2010, teaches a pipeline inspection tool that has an even number of pole magnets, each spiraled around the tool body so that a second end of each magnet is offset by an amount relative to a first end. The rotation is applied to the magnets to produce a magnetic field oblique to the longitudinal body axis. The tool includes two pole magnets oriented at an oblique angle relative to the longitudinal body axis. An array of sensor coil sets is located between opposing edges of the two magnets and oriented perpendicular to the axis. Each set includes a transmitter coil and two opposing pairs of receiver coils that are gated to receive reflections from the wall of the tubular member. Because the line of coils is rotated relative to the magnetic bias field, the receiver coils are in-line with, and have the same angular orientation as, the transmitter coil.

U.S. Patent Application Publication No. 2002/0069704, published on Jun. 13, 2002 to E. S. Robb, provides a tubular inspection device having a first movable sensor head and has an electromagnetic tubular inspection device that is coupled to the device in the form of a second movable sensor head. The ultrasonic and the electro-magnetic sensors are typically capable of inspecting the integrity of a tubular. A rotation mechanism is coupled to the device to provide relative rotation between a tubular to be inspected and the ultrasonic and electromagnetic tubular inspection devices.

U.S. Pat. No. 8,089,273, issued on Jan. 3, 2012 to P. M. Hoyt, shows a spiral magnetic field apparatus for inspecting the wall of a pipeline while traveling therethrough. The system has a portion of a pipe having a pipe wall forming a cylindrical tube defining a circumferential direction and an axial direction. An in-line inspection tool is positioned within this portion of the pipe. The in-line inspection tool includes a frame extending in the axial direction and at least one magnet connected to the frame in position to generate a magnetic field. The magnetic field is oriented obliquely with respect to the circumferential and axial directions of the pipeline. The inspection tool has a transmitter connected to the frame to generate an inspection signal within the magnetic field.

It is an object to the present invention to provide an electromagnetic multifunction inspection apparatus which allows at least 100% inspection coverage.

It is another object of the present invention to provide an electromagnetic multifunction inspection apparatus which allows for easy replacement of the detectors therein.

It is another object of the present invention to provide an electromagnetic multifunction inspection apparatus that provides multiple sets of magnetic flux sensors in order to enhance the flexibility of standardizing.

It is another object the present invention to provide an electromagnetic multifunction inspection apparatus that allows for easier inspection of charts.

It is another object the present invention to provide an electromagnetic multifunction inspection apparatus that has more discerning interpretation of depth defects and flaws.

It is another object of the present invention to provide an electromagnetic multifunction inspection apparatus that has enhanced inspection capabilities.

It is another object of the present invention to provide an electromagnetic multifunction inspection apparatus that reduces the length of the Hall Effect sensors that are used.

It is a further object of the present invention to provide an electromagnetic multifunction inspection apparatus that enhances the rate of inspection.

It is another object of the present invention to provide an electromagnetic multifunction inspection apparatus whereby each individual detector is easily and individually changeable.

It is another object of the present invention to provide an electromagnetic multifunction inspection apparatus that allows the sensors and the electromagnets to be preassembled and then inserted and fastened into place.

These and other objects and advantages of the present invention will become apparent from a reading of the attached specification and appended claims.

BRIEF SUMMARY OF THE INVENTION

The present invention is a flaw detection apparatus for use with a tubular. The flaw detection apparatus has a helix conveyor adapted to receive the tubular thereon, a frame positioned over a center section of the helix conveyor, and a plurality of inspection devices retained by the frame so as to detect flaws in the tubular as the helix conveyor moves the tubular through the frame. The helix conveyor has an entry section, and exit section and the center section positioned between the entry section and the exit section.

The helix conveyor has a plurality of sets of rollers. The plurality of sets of rollers are angularly adjustable relative to a longitudinal axis of the helix conveyor. Each of the plurality of sets of rollers is supported by a base plate on the helix conveyor. The base plate is connected to an actuator so as to move the sets of rollers between an orientation transverse to the longitudinal axis of the helix conveyor to a position angularly offset from the orientation transverse to the longitudinal axis of the helix conveyor. In an embodiment of the present invention, each of the plurality of sets of rollers includes V-rollers.

The frame has a plurality of legs extending downwardly therefrom. The plurality of legs are adapted to support the plurality of inspection devices above an underlying surface and adjacent to the tubular on the helix conveyor. Each of the pair of legs has a hydraulic or pneumatic actuator cooperative therewith so as to adjust a height of the frame.

The plurality of inspection devices can be selected from the group consisting of a longitudinal inspection device, a Hall Effect inspection device, an oblique inspection device, a grade verification/comparator device, a transverse inspection device, along with combinations of these inspection devices.

One of the inspection devices is a grade verification/comparator device. The grade verification/comparator device has a grade comparator core comparator or coil. The grade comparator coil is positioned in the center section of the helix conveyor. The grade comparator coil is positioned adjacent to an entry into the center section of the helix conveyor. The grade comparator coil has an opening adapted to allow the tubular to pass therethrough.

Another of the inspection devices is a Hall Effect wall thickness inspection device. The Hall Effect wall thickness inspection device has a pair of opposed non-rotating magnets supported by the frame and a plurality of Hall Effect magnetic flux leakage detectors arranged longitudinally between the pair of opposed non-rotating magnets. The pair of opposed non-rotating magnets are adapted to generate a magnetic flux field around each side of the tubular. The plurality of magnetic flux leakage detectors are connected to an actuator adapted to move the plurality of magnetic flux leakage detectors into proximity of the tubular. The plurality of magnetic flux leakage detectors has a plurality of sensors contained in the housing. The actuator is adapted to move the housing between an open position and a closed position.

Another of the inspection devices is an oblique inspection device. The oblique inspection device has a pair of offset opposing magnets adapted to generate a magnetic flux field in an oblique direction through the tubular and a row of sensor housings containing at least one obliquely-oriented sensor element. The pair of offset opposing magnets comprise a first pair of electromagnets positioned within the frame, and a second pair of electromagnets positioned in the frame opposite the first pair of electromagnets. The first and second pairs of electromagnets are arranged obliquely to a longitudinal axis of the tubular. Each electromagnetic of the first and second pair of electromagnets has a triangular-shaped shim on a face thereof. The triangular-shaped shim is adapted to maintain the electromagnet in close proximity to an exterior surface of the tubular. The at least one obliquely-oriented sensor element is arranged 90° relative to an oblique magnetic flux generated by the second pair of electromagnets. The obliquely-oriented sensor element includes at least a pair of sensor elements in each housing of the row of sensor housings. Each sensor housing of the row of sensor housings is contoured so as to fit an outer diameter of the tubular.

Another of the inspection devices is a longitudinal inspection device. The longitudinal inspection device includes a housing received within the frame, at least two electromagnets positioned in the housing, and a row of longitudinal detectors position in the housing. The longitudinal inspection device further comprises a positioning detector positioned in the housing and adapted to sense the presence of a tubular entering the housing. An actuator is connected to the row of longitudinal detectors. The actuator is connected to the positioning detector such that the actuator opens or closes the row of longitudinal detectors relative to a signal from the positioning detector. The row of longitudinal detectors comprise at least two rows of longitudinal detectors. The housing is positioned between the entry section and the exit section of the helix conveyor.

This foregoing Section is intended to describe, with particularity, the preferred embodiments of the present invention. It is understood that modifications to these preferred embodiments can be made within the scope of the present claims. As such, this Section should not to be construed, in any way, as limiting of the broad scope of the present invention. The present invention should only be limited by the following claims and their legal equivalents.

DETAILED DESCRIPTION OF THE INVENTION

Figure 1:
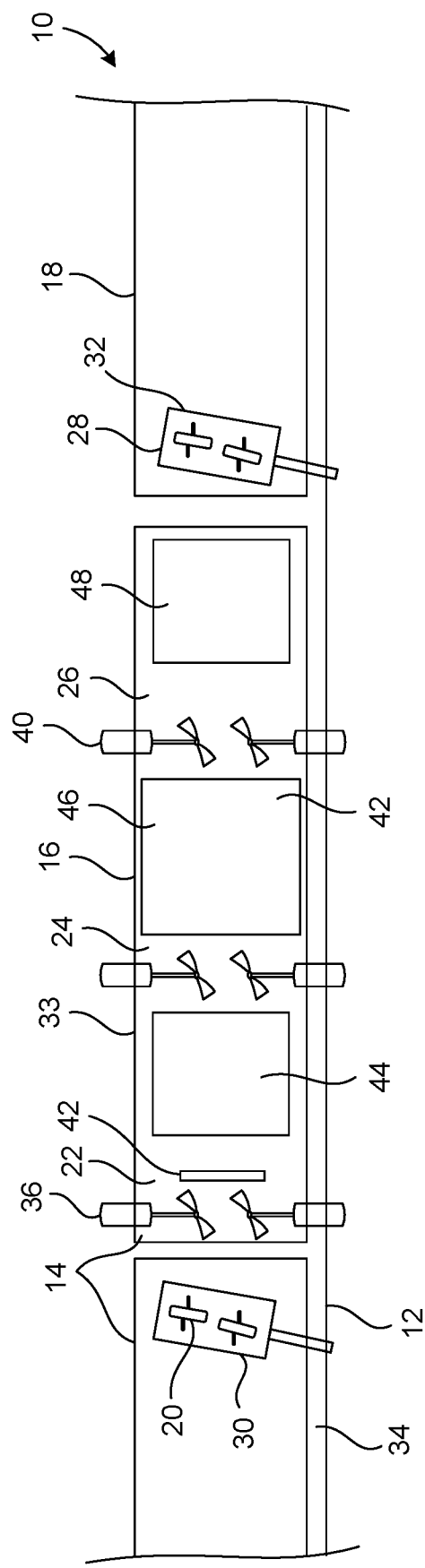
FIG. 1 is a plan view of the electromagnetic flaw detection apparatus of the present invention.

The multifunction electromagnetic flaw detection device of the present invention is utilized for the inspection of steel oilfield tubular goods. These tubular goods can include oil country tubular goods (drill pipe, casing pipe and tubing pipe). The present invention performs four separate inspection functions located in up to four separate non-rotating locations within the center section of the helixing conveyor. The helixing conveyor is utilized for all of the inspection functions. This helixing conveyor is adjustable so as to rotate and advance the tubular through the various non-rotating inspection function housings. During the standardization process of the various inspection function sensors, an adjustment system is employed which allows the tubular to be helixed into the position of the pertinent detectors that require standardization. The adjustment element, such as a pneumatic or hydraulic actuator, can be adjusted to 90° to the longitudinal axis of the tubular and will rotate the tubular in place so as to allow adjustment of each detector sensor to facilitate the standardization process. This process is repeated until the longitudinal, Hall Effect wall thickness, oblique and grade comparator functions are standardized. Once all of the functions are standardized in the above-mentioned process, the helix adjuster will be set to the desired helix width to achieve at least 100% inspection coverage. The standardization tubular will then helix through the inspection functions to verify detectability of each function dynamically before beginning the inspection of the tubulars requiring inspection.

The grade verification/comparison detection system is mounted at a first position at the entry of the center section of the helix conveyor. The difference between the prior art grade comparison inspection and the present invention is a radically different standardization process plus a greater excitation of the grade coils due to the helixing of the tubular through the grade coil located at the incoming side of the center section. The present invention utilizes a prior art comparator-bridge type of grade comparator that places one standardization induction coil on a joint that is on a storage rack outside the multi-function electromagnetic inspection unit and a second inspection coil on the in-feed of the inspection unit. The present invention utilizes a tubular for standardization that is vastly different from the grade of tubulars that will be inspected.

A first step of the initial standardization of the present invention is to place the outside grade coil onto a tubular of the same grade, wall thickness and size that is on a storage rack outside the inspection unit. The standardization of the grade comparator's electronic display is performed after one of the tubulars that is to be inspected is conveyed into the inspection grade coil in the unit and stopped. The electronic grade display "Null" function is adjusted to read "000" or as close to zero as possible. The tubular is conveyed back out of the grade coil on the unit and the open hole reading of the display is recorded. The outside coil is removed from the tubular of the same grade, wall thickness and size that is on the storage rack outside the inspection unit and is placed on to a joint that has a higher grade and heavier wall thickness. The open hole reading will be a substantially higher reading and is again recorded. The same tubular that was used to "zero" the display is conveyed back to the grade coil in the unit and stopped. The resultant measurement reading will be recorded and the upper and lower alarm threshold of the grade electronics will be set to alarm if the variation from the resultant reading exceeds the alarm threshold's upper or lower levels. If the grade of the tubulars that are to be inspected is actually a highest grade, then a highest-grade tubular that is of a larger size and a heavier weight per foot can be used for standardization.

The longitudinal flaw detection device and the Hall Effect wall thickness detection device are contained within the non-rotating inspection apparatus. Both the longitudinal inspection and Hall Effect inspection devices utilize two directly opposing non-rotating magnets that generate a magnetic flux field around each side of the circumference of the tube at a 90° angle to the longitudinal axis of the helixing tubular. Instead of the prior art detectors/sensors, the magnetic flux leakage detectors of the present invention will be a row of individual radiused contoured longitudinal sensor housings containing one or more sensor elements per detector housing. When a different size of tubular is to be inspected, each individual detector can be changed manually, one at a time, or an entire preassembled longitudinal, or oblique, inspection assembly fixture that contains the individual detectors, detector arms, opening/closing means, quick connection fluid ports for actuation of the detector arms, and a detector signal connector can be attached via a slide-in or drop-in assembly unit. The assembly unit can be inserted and fastened into place. The fluid line for the detector actuators and the detector signal cables will be plugged into the assembly unit.

The use of multiple sets of magnetic flux sensor elements in each individual detector housing allows greater flexibility for standardizing on various artificial notches or drilled holes that are retained and routinely used for calibrating prior to commencing the inspection of tubulars. For example, when standardizing for the inspection of new manufactured tubulars, the signal response from an internal notch is significantly weaker than the same size and depth notch located on the outside diameter surface. The external notch magnetic flux leakage is very close to the sensors in the detector housing that is riding on the outside surface of the tubular (as compared to the internal notch). The first sensor element in each of the detector housings will be standardized and adjusted using known prior art adjusting electronics to adjust the flaw indication height of an American Petroleum Institute (API) prescribed 10% notch located on the internal surface of the tubular. All of the internal flaw indications from the internal notch will be displayed on one inspection strip chart channel and adjusted to similar amplitude heights. The second sensor in the detectors will be standardized utilizing an API 10% notch located on the outside diameter and will be displayed on a second channel and so on for each additional sensor located in the other individual detector housings. Each subsequent individual detector sensor will be adjusted during standardization to display a similar presentation on the relevant strip charts. The ability to match the amplitude of the internal and external display charts is a significant benefit to the personnel interpreting the charts.

When inspecting used tubulars that are retrieved from a well, API or customer classification brackets may be set (for example, at 0% to 15%, 15.1% to 25%, 25.1% to 35% and 35.1% to 50%) in order to allow the varied utilizations of the tubular classifications. If a prior art single sensor detector is used, the entire classification ranges from 0% to 50% would need to be standardized using the same detector sensor, thus jeopardizing either the lower or higher flaw interpretation. The multiple sensors allow for a more discerning interpretation of the various depths of the defects and flaws. For instance, the standardizing of the 0% to 25% level using the first sensor of each detector on one strip chart channel and the standardizing of the 25.1% to 50% level using the second sensor of each detector and displaying on a second strip chart channel will allow for this more discerning interpretation of the various depth defects and flaws. An additional third sensor in one detector housing could further enhance inspection capabilities and interpretation of displayed flaw channels.

In the longitudinal flaw inspection device of the present invention, a first pair of magnets are employed which utilize shim plates to adjust the face of the magnets to close proximity to the outer diameter of the tubular. The first pair of magnets can be movable to an open or closed position or if the magnets are fixed, they can utilize the shim plates to approach this close proximity to the tubular. The face of each magnet is positioned perpendicularly to the longitudinal axis of the tubular. Alternatively, each magnet can be moved away from the tubular mechanically to allow entry of the tubular and move in close proximity to the tubular once the tubular has entered the inspection housing. The magnets move away from the tubular once the inspection of the tubular is complete.

Each individual radiused contoured longitudinal sensor housing can be raised mechanically to allow entry of the tubular. Once the end of the tubular enters, the individual longitudinal detector housings are closed by mechanical means and contact with the outer diameter the tubular using electronic sensing devices that detect when the tubular has entered the housing. Once the opposite end of the tubular has completed the inspection process, the detectors open in order to allow safe exit from the inspection housing. Alternatively, the detectors can be fitted with sloping arrangements which will allow an entering tubular to push upon the detector housing and then close as the tubular exits the detector housing. The number of individual radially-contoured longitudinal detector housings will be sufficient to assure at least 100% inspection coverage. Inspection coverage overlap is achieved by staggering the individual detectors on opposite sides of the top of large diameter tubulars in a manner to assure overlap of the sensors. On smaller diameter tubulars, the detectors are placed on the top and bottom of the tubular in a manner so as to accomplish at least 100% inspection coverage.

If a sensor coil malfunctions in the prior art, the entire housing is no longer acceptable for use. In contrast, if an individual radially contoured longitudinal sensor housing malfunctions, only the detector that is failed is replaced in the present invention. The axial length of the longitudinal inspection is contingent on the width of the pair or pairs of magnets along the individual axis of the tubular.

A pair of mechanically-operated helix-type rollers are positioned adjacent to the entry side and exit sides of the helix conveyor in order to close up against the helixing tubular and tubular in order to provide centering of the helixing tubular as it enters, passes through, and then exits the inspection housing. This also serves to prevent the magnets from grabbing the tubular.

The Hall Effect wall thickness inspection function of the inspection process of the present invention detects variations in the magnetic flux field caused by the presence of wall thickness variations in the steel tubular. The Hall Effect wall thickness inspection function is accomplished by using the same non-rotating magnetic flux field generated by the first pair or pairs of electromagnets. The Hall Effect sensors will be contained in a narrow longitudinally-oriented housing that is the same length as the multiple longitudinal inspection detector housings and positioned within the magnetic flux field generated by the width of the magnets. The Hall Effect sensor housing will be mounted along the longitudinal axis of the outer diameter of the tubular and raised to allow entry of the tubular. The housing is then lowered near the surface of the tubular during the inspection process. While the Hall Effect sensor is positioned in the closed position near the outer diameter of the tubular, the calibration process is conducted. The Hall Effect sensors are mounted with a mechanism for adjusting the Hall Effect sensor housing in the X-Y plane while rotating a test joint of the same description (i.e. size, nominal wall thickness, grade etc.) as the string of pipe that is to be inspected. The test joint contains a man-made known depth/remaining body wall thickness reduction. Once the optimal wall thickness signal response is achieved from the desired artificial, or naturally-occurring wall reductions in the test joint, the Hall Effect sensor adjustment device is locked into place for the inspection process. The Hall Effect sensor is retracted to the open position in preparation to allow the tubulars with larger upsets or couplings to enter the housing. In the prior art, the Hall Effect wall thickness sensors are distributed around the circumference of the outer diameter of the tubular. For tubulars having an outer diameter of 13⅜", the number of sensors to provide at least 100% coverage would need to extend around the forty-two inch circumference of such 13⅜" outside diameter tubular. In the present invention, by utilizing the Hall Effect wall thickness sensors along the longitudinal axis of the helixing 13⅜" tubular within the non-rotating housing, the number of Hall Effect sensors would be reduced to an approximate length of ten inches along the longitudinal axis of the tubular to achieve the same inspection production rates of the prior art.

A doglegged or bent tubular that may damage the components of any of the inspection assemblies are segregated and are not allowed to helix through the longitudinal station. The housing can be fitted with a set of mechanically-driven centralizing pinch-type helix rollers on the entry and exit sides or at the top/bottom of the housing to prevent attraction and grabbing by the electromagnets.

The inspection device of the present invention can be an oblique inspection device for the detection of obliquely-oriented flaws/defects found on tubulars. The inspection for oblique and three-dimensional flaws (plus the Hall Effect inspection), if desired, utilizes the same two offset opposing non-rotating magnets to generate a magnetic flux field in an oblique direction through the helixing tubular. In some instances, it may be advantageous for a Hall Effect wall thickness sensor housing to be installed within the frame in addition to the Hall Effect sensors in the longitudinal frame or as a stand-along Hall Effect wall thickness inspection device that utilizes the oblique magnetic flux field. The magnetic flux leakage flaw detector/sensors will be an individually, radially-contoured sensor housing containing one or more obliquely-oriented sensor elements per detector housing. The same stipulations that are asserted for the longitudinal detectors and Hall Effect sensors apply for the oblique inspection detectors and Hall Effect sensors.

A second pair or pairs of offset electromagnets are mounted within the frame in a position on opposite sides of the tubular oblique to the longitudinal axis of the tubular. Triangular-shaped metal shims are attached to the face of each magnet to maintain the faces of the magnet within close parallel proximity to the outside surface of the tubular. The magnetic flux leakage inspection for two-dimensional oblique flaws and three-dimensional flaws (such as corrosion, pits, gouges, etc.) is achieved utilizing magnetic flux leakage sensors that are contained in multiple individual detector/sensor housings that are contoured to fit the outside diameter of the tubular on the outside surface of the tubular. The individual contoured flux leakage sensor elements are arranged within each individual detector/sensor housing and oriented 90° to the oblique magnetic flux angle generated by the second pair or pairs of obliquely-oriented electromagnets. The number of individual contoured oblique sensor housings are sufficient to assure greater than 100% inspection coverage. The inspection coverage overlap is achieved by staggering the individual contoured oblique sensor housings on opposite sides of the tubular. When a different size of tubular is to be inspected, each individual detector can be changed manually one at a time or an entire preassembled oblique inspection assembly fixture (that contains the individual detectors, detector arms, opening/closing mechanism, quick connection fluid ports for actuation of the detector arms and the detector signal connectors) can be attached via a slide-in or drop-in assembly unit. The assembly unit will be inserted and fastened into place. The fluid line for the detector actuators and the detector signal cables can be plugged in to the assembly unit.

The electromagnetic flaw detection apparatus of the present invention can detect two-dimensional transverse flaws, such as transverse cracks, and three-dimensional flaws, such as pits, corrosion, mechanical damage, and gouges. The prior art inspection units convey a tubular linearly through the transverse inspection housing. In essence, the longitudinal flaws pass under the longitudinally-oriented sensors in a helical motion. In contrast, in the present invention, the tubular will helix through the inspection unit in such a manner so as to produce a helix angle on smaller size tubing joints exceeding 45° from the circumferential direction. Presently, a prior art four function inspection unit conveys a tubular through the unit at a forward velocity of at least sixty feet per minute or one foot per section on all sizes that the unit is capable of inspecting. Again, the combination of the forward linear conveyance of the tubular to a spinning set of detectors creates a helix inspection path of flaws passing under the spinning longitudinal detector sensor. The prior art spinning longitudinal detectors detect helixing longitudinal two-dimensional flaws (such as seams) in the same manner as the transverse assembly of the prior art will detect a helixing transverse two-dimensional flaw (such as a transverse crack) on the helixing tubular of the present invention. The longitudinal rotating inspection assembly detectors of the prior art revolve around the tubular at approximately sixty to eighty r.p.m. and at one foot per second forward linear velocity creating a resultant helix angle in the prior art longitudinal detectors on an API size of 2⅜" outside diameter tubing of approximately 57°. The resultant angle of an API size of 3.5" outside diameter tubing will be approximately 45°. Even when the resultant helix angle is greater than 57° from the circumferential direction, the longitudinal sensor coil in the prior art longitudinal detector detects the longitudinal artificial man-made standardization notches and the naturally-occurring longitudinal-oriented along the longitudinal axis of the tubular. Therefore, the commercially available electronics console, transverse head and transverse detectors of the prior art can be utilized for the construction of the present invention four function inspection unit. The size range matches one of the standard prior art four function units that is presently used to inspect tubular sizes of 2⅜"-3.5". By adding a second or third pair of electromagnets and adding an additional or longer individual detectors for use in the present invention, a resulting angle of at least 45° can be achieved. This is because the helixing forward progress through the inspection unit greatly improves the inspection production rate of the unit.

The prior art transverse detector/sensors contain only one sensor element per detector. The magnetic flux leakage detectors of the present invention will contain at least two sensor elements per detector housing. The advantages concerning the calibration/standardization and inspection detection when utilizing the multiple sensor element longitudinal detectors are also found in the multi-sensor transverse detectors of the present invention.

When a string of different size tubulars are to be inspected, each individual detector can be changed manually one at a time or an entire preassembled transverse inspection assembly fixture that contains the individual detectors, the detector arms, the opening/closing mechanism, the quick-connection fluid ports, and the detector signal connector can be attached via a slide-in or drop-in assembly unit.

On large size tubulars, the ultrasonic inspection described in U.S. Pat. No. 5,431,054 to the present inventor, can be utilized. In particular, this utilizes ultrasonic detection of transversely-oriented two-dimensional flaws (such as transverse cracks) and three-dimensional flaws (such as pits, cuts, gouges, etc.) as the final inspection function located at the exit end of the center section. A wiper or high-pressure air blower can remove excess water and can be positioned between the ultrasonic transverse inspection device (described in U.S. Pat. No. 5,431,054) and the other inspection functions.

FIG. 1 shows the multifunction flaw detection apparatus 10 in accordance with the present invention. In particular, there is a helixing conveyor 12 that is adapted to receive the tubular thereon. The helixing conveyor 12 has an entry section 14, a center section 16 and an exit section 18. The helixing conveyor 12 includes a plurality of sets of rollers 20, 22, 24, 26 and 28. Each of the sets of rollers 20, 22, 24, 26 and 28 is angularly adjustable relative to a longitudinal axis of the helixing conveyor 12. The set of rollers 20 is positioned on a base plate 30. The set of rollers 28 is also positioned on a base plate 32. An actuator 34 connects with the base plates 30 and 32 so as to move the sets of rollers 20 and 28 between an orientation transverse to a longitudinal axis of the helixing conveyor 12 to a position angularly offset from this orientation transverse to the longitudinal axis of the helixing conveyor 12. FIG. 1 further shows that rollers 22, 24 and 26 include actuators 36, 38 and 40 which act on the rollers 22, 24 and 26, respectively, so as to open and close the rollers upon the entry of the tubular into the center section 16.

As will be described hereinafter, a frame 42 is positioned over the center section of the helixing conveyor 12. A plurality of inspection devices will be retained by this frame so as to detect flaws in the tubular as the helixing conveyor 12 moves the tubular through the frame 42.

In FIG. 1, the entry section 14 can be raised or lowered, as desired. As such, the entry section 12 can be lowered so as to allow the tubular to be loaded onto the set of rollers 20. Alternatively or in conjunction with the raising and lowering of the entry section 14, the center section 16 and the exit section 18 can also be raised or lowered as desired. A grade comparator coil 42 is positioned in the center section 16 adjacent to the entry section 14. The grade comparator coil 42 will have an opening therein which allows the tubular to pass therethrough. The longitudinal inspection housing 44 is located downstream from the comparator coil 42. The oblique inspection housing 46 is positioned within frame 42 and located further downstream from the longitudinal inspection housing. The transverse inspection housing 48 will be positioned in the frame 42 and located further downstream from the oblique inspection housing 46.

The center section 16 will contain the entire inspection function stations 42, 44, 46 and 48. The center section 16 can mechanically raise or lower the various magnets and detectors in order to vertically center these magnets and detectors for different size tubulars. Between the individual inspection function housings 44, 46 and 48, there are vertical or horizontal-mounted mechanically adjustable and mechanically-powered helix rollers 36, 38 and 40. These can be photocell or mechanically-operated devices that close the helix rollers as the tubular enters each assembly and then opens as the tubular exits each of the inspection housings.

The comparator coil 42, the longitudinal inspection housing 44, the oblique inspection housing 46 contain mechanisms (as will be described hereinafter. The transverse inspection housing 48 will be in accordance with prior U.S. Pat. No. 5,431,058 to the present inventor.

Figure 2:
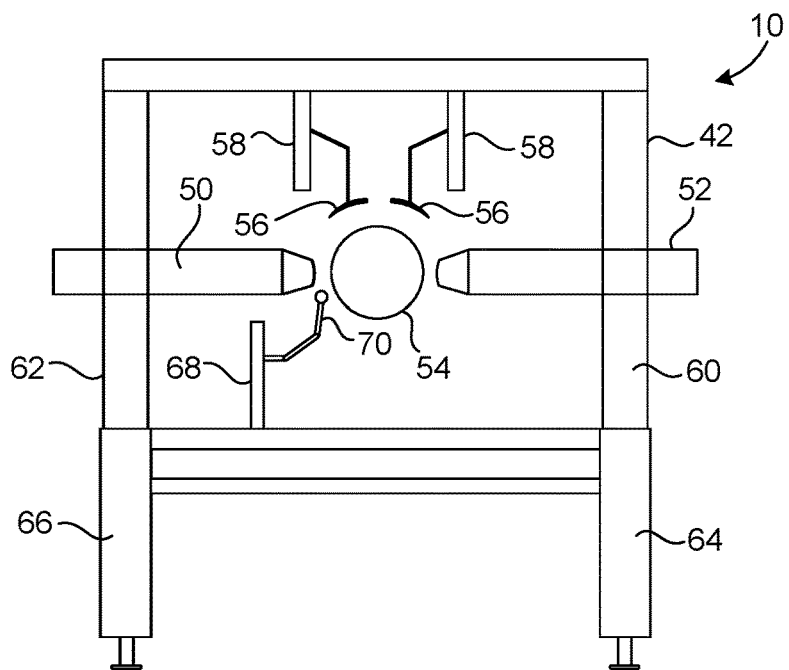
FIG. 2 is an end view showing the electromagnetic magnetic flaw detection apparatus of the present invention.

FIG. 2 shows an end view of the multifunction electromagnetic flaw inspection apparatus 10 of the present invention. In particular, FIG. 2 illustrates the non-rotating longitudinal inspection device for the oblique inspection device. In FIG. 2, there are two electromagnets 50 and 52. Electromagnets 50 and 52 are located on opposite sides of the tubular 54. Longitudinal or oblique inspection detectors 56 are positioned adjacent to the tubular 54. Detector actuators 58 are cooperative with the longitudinal or oblique inspection detectors 56 so as to allow for an opening or closing of the detectors 56. FIG. 2 shows the longitudinal or oblique inspection detectors 56 as spaced away from the outer diameter of the tubular 54. When the tubular 54 enters this inspection housing, the actuators 58 will move so as to bring the detectors 56 into proximity with the outer diameter of the tubular 54. An entire pre-assembled longitudinal or oblique inspection detector assembly unit is provided.

The frame 42 will retain the electromagnets 50 and 52, the longitudinal oblique inspection detectors 56 and the actuators 58 therein. Frame 42 includes legs 60 and 62 that have hydraulic or pneumatic actuators 64 and 66 at the lower end thereof. These actuators 64 and 66 will allow for the raising and lowering of the frame 42 in order to accommodate various sizes of tubulars therein. The longitudinal or oblique inspection detectors 56 can include multiple staggered detectors with longitudinal or oblique sensor elements. The electromagnets 50 and 52 can be either longitudinal or oblique type electromagnets. An adjustment plate 68 can accommodate multiple Hall Effect sensors. An adjustment helix 70 has a roller and articulating arms for standardizing the Hall Effect sensors.

The structure shown in FIG. 2 can be an entire preassembled longitudinal or oblique inspection detector assembly unit that contains the detectors, the detector arms, the opening/closing mechanism, the quick-connection fluid ports for actuation of the detector arms, and the detector signal connector. This preassembled unit can be inserted and fastened into place upon the helixing conveyor 12. The external fluid line for the detector actuators and the detector signal cables from the electronic console can be plugged into the detector pre-assembly. Automatic actuator controls, such as a photocell or alternative device, can be strategically placed on the entry and exit side of the inspection station so as to close the detectors upon entry of the tubular 54. Alternatively, devices can be strategically placed on the entry and exit sides of the inspection station to close the detectors upon entry of the tubular 54 and to open the detectors upon exit from the station. This entire frame 42 is located between the entry section 14 and the exit section 18 of the helixing conveyor. The mechanically-driven helix rollers 36, 38 and 40 (shown in FIG. 1) can be located on the entry and exit sides of the frame 42 to prevent attraction and grabbing the electromagnets 50 and 52.

FIG. 2 further illustrates the addition of the Hall Effect wall thickness inspection detection sensor housing into the non-rotating housing. The Hall Effect wall thickness detection sensors 70 are adjusted via a positioning means within the magnetic flux field between the electromagnets 50 and 52 and the tubular 54 in a manner that will maximize the detectability sensitivity of the sensors. The Hall Effect sensors do not require contact with the tubular 54. The entire center section 16 can raise or lower via the actuators 64 and 66 to center the frame 42 in relation to the different sizes of tubulars 54.

Figure 3:
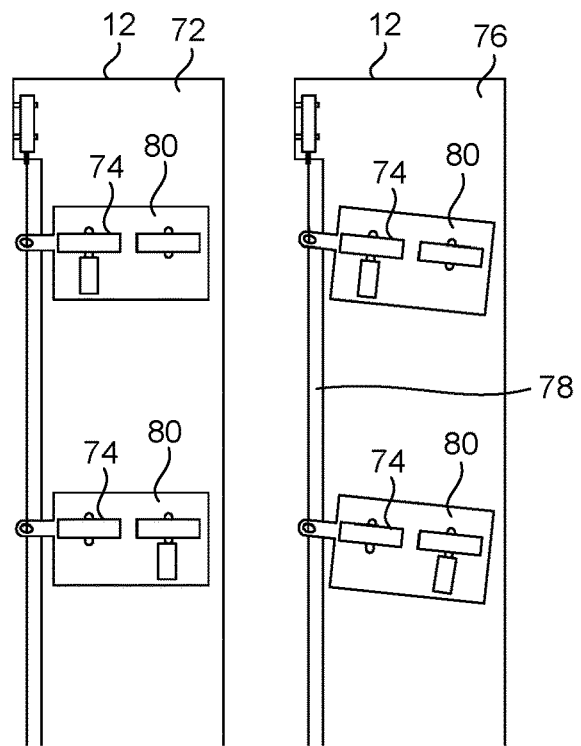
FIG. 3 is a plan view of the helix conveyor system of the present invention showing the movement from an orientation transverse to the longitudinal axis of the helix conveyor to a position angularly offset from transverse to the longitudinal axis of the helix conveyor.

FIG. 3 illustrates one type of helixing conveyor 12. The configuration of helixing conveyor 12 illustrated at 72 shows the sets of rollers 74 extending transverse to a longitudinal axis of the helixing conveyor 12. The configuration of the helix conveyor 12 shown at 76 at the right side of FIG. 3 shows the sets of conveyors 74 as moved by actuator 78 to an orientation angularly offset from transverse to the longitudinal axis of the helixing conveyor 12. The helixing conveyor 12, as shown at 72, will allow the tubular to spin in place for standardizing and not helix along the longitudinal axis of the tubular. The helixing conveyor 12, shown at 74, allows the rollers 74 to be adjusted in unison the helix the tubular through the center section 16 along the longitudinal axis of the tubular. In particular, the actuator 78 will pivot the base plates 80 that support the rollers 74 on the entry side and exit side of the helixing conveyor at an angle so as to cause the tubular to helix through the inspection housing at a particular spiral path helix width that will achieve at least 100% inspection coverage for the size of the tubular under inspection.

Figure 4:
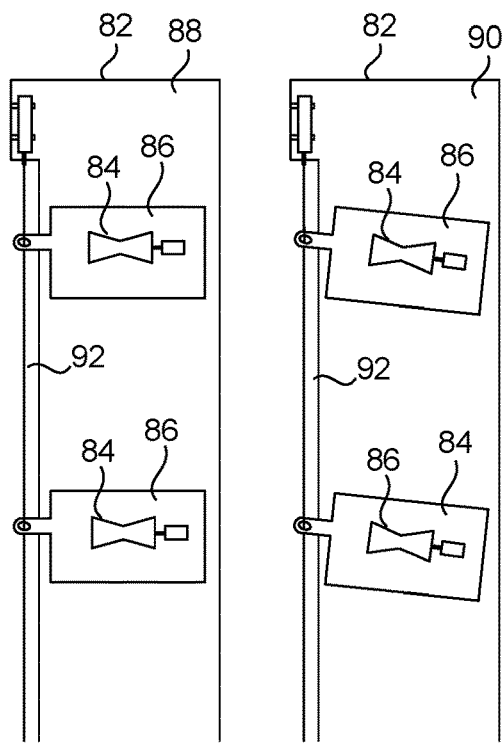
FIG. 4 is a plan view of the helix conveyor of the present invention as utilizing a series of V-rollers.

FIG. 4 shows another type of helixing conveyer 82 having V-rollers 84 on base plates 86. The helixing conveyor 82 illustrated at 88 on the left side of FIG. 4 will not helix the tubular along the longitudinal axis of the tubular. Once the V-roller base plates 86 are mechanically adjusted in unison to an angle, such as illustrated by the helixing conveyor at 90, the tubular will advance in a helical path along the longitudinal axis of the tubular. If a particular design of the complete inspection unit envisioned by the present invention utilizes a forward pass followed by a reverse pass through an inspection center section, then the adjustment arm 92 will pass the tubular linearly through the inspection assemblies for the transverse inspection of the prior art and then readjust the helix the tubular through the other inspection devices of the present invention.

Figure 5:
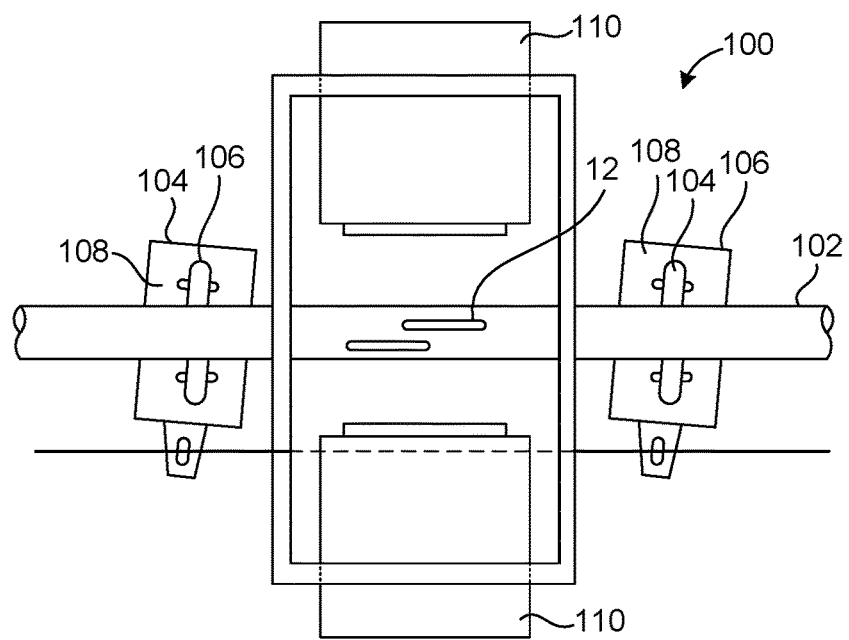
FIG. 5 is a top view of a single set of magnets of the longitudinal inspection device of the present invention.

FIG. 5 is a top view of the longitudinal inspection device 100 of the present invention. Longitudinal inspection device 100 is configured so as to detect longitudinal flaws in the tubular 102. In particular, tubular 102 will be supported by helix conveyor 104 having rollers 106 supported on a base plate 108. Electromagnets 110 are located on opposite sides of the tubular 102. The detectors 112 are supported in proximity to the outer diameter of the tubular 102. For larger diameter tubulars, the sets of detectors 112 can be mounted so as to slide-in or drop-in with a preassembled detector assembly. The rows of detectors 112 are located on the top of the outer diameter of the tubular.

Figure 6:
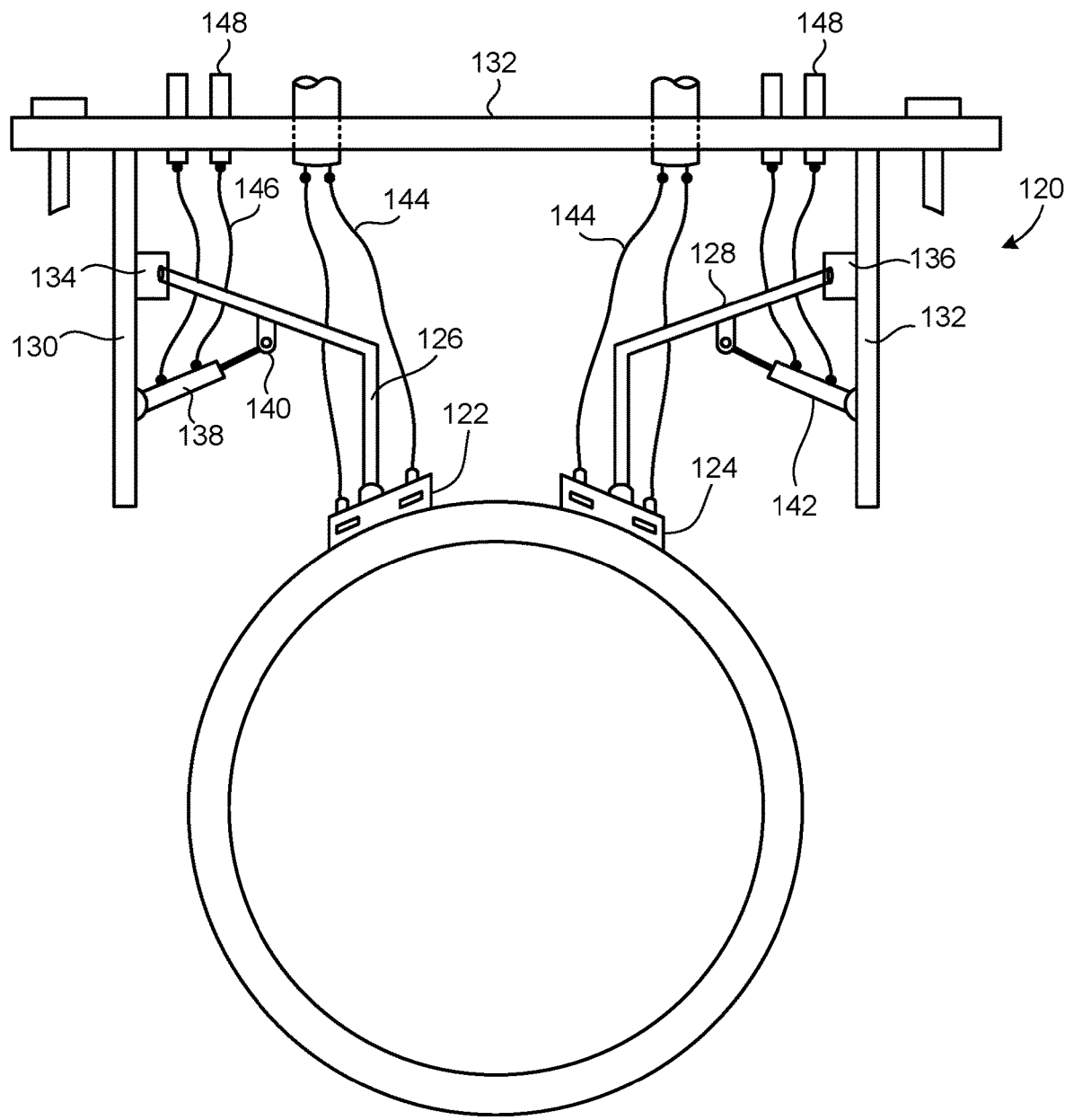
FIG. 6 is an end view of pre-assembled detectors on each side of the tubular that is inspected.

FIG. 6 shows the preassembly of the various detector elements as part of a slide-in or drop-in assembly. This preassembly 120 can be used to drop-in from the top of the frame 42 or are slide-in from the side of the frame 42. FIG. 6 shows this preassembly 200 as having detectors 122 and 124 as supported by respective arms 126 and 128. Support 130 extends downwardly from the top 132 of the preassembly 120. Support 132 also extends downwardly from the top 132 of the preassembly 120. The arm 126 is pivotally mounted to a bracket 134 on arm 130. Arm 128 is pivotally mounted to a bracket 136 on arm 132. An actuator 138 is pivotally connected at 140 to arm 126 and is fastened to the support 130 below the bracket 134. Actuator 138 serves to pivot the detector 122 between the open position (as illustrated in FIG. 2) and the closed position (as illustrated in FIG. 6). Actuator 142 is pivotally connected to arm 128 and is fastened to support 132. Once again, actuator 142 can move the detector 124 from the open position (as illustrated in FIG. 2) to the closed position (as illustrated in FIG. 6).

FIG. 6 shows that there are signal lines 144 that serve to transmit signals from the detectors 124. Additional lines 146 extend toward the actuator 132 so as to provide an activation signal for the pivoting and movement of the arms 126 and 128. Plug-in connections 148 extend outwardly of the top 132 of preassembly 120.

Figure 7:
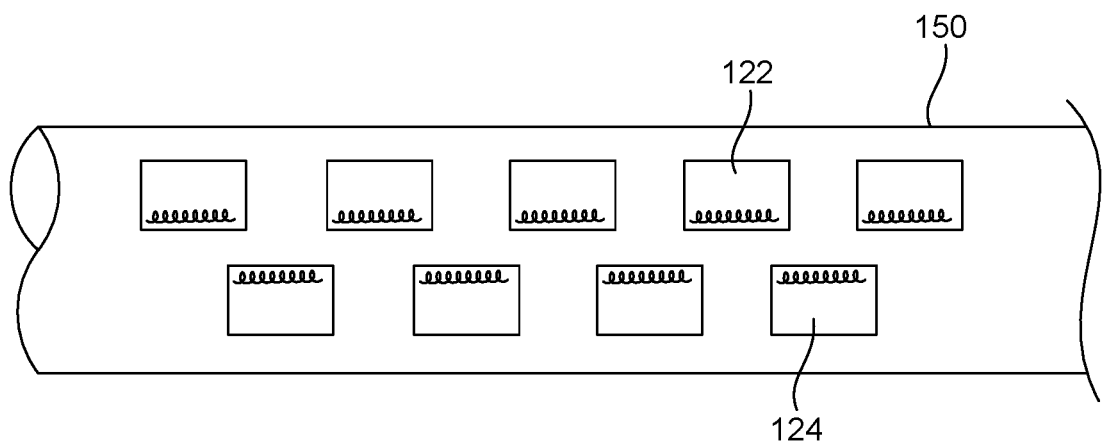
FIG. 7 illustrates the configuration of the detectors relative to the tubular.

FIG. 7 shows the configuration of the detectors 122 and 124 relative to the tubular 150. It can be seen that there are two rows of longitudinal detectors 122 and 124 that serve to provide at least 100% inspection coverage of larger diameter tubes. Two rows of detectors that contain oblique sensors can also be provided so as to provide at least 100% inspection coverage of larger diameter tubulars. Each of the detectors 122 and 124 is located in a separate rows in spaced relation to each other. The detectors 122 of one row are aligned with each other. Similarly, the detectors 124 of the other row are aligned with each other. The detectors 124 will be located in spaced relation to the gaps located between the detectors 122.

Figure 8:
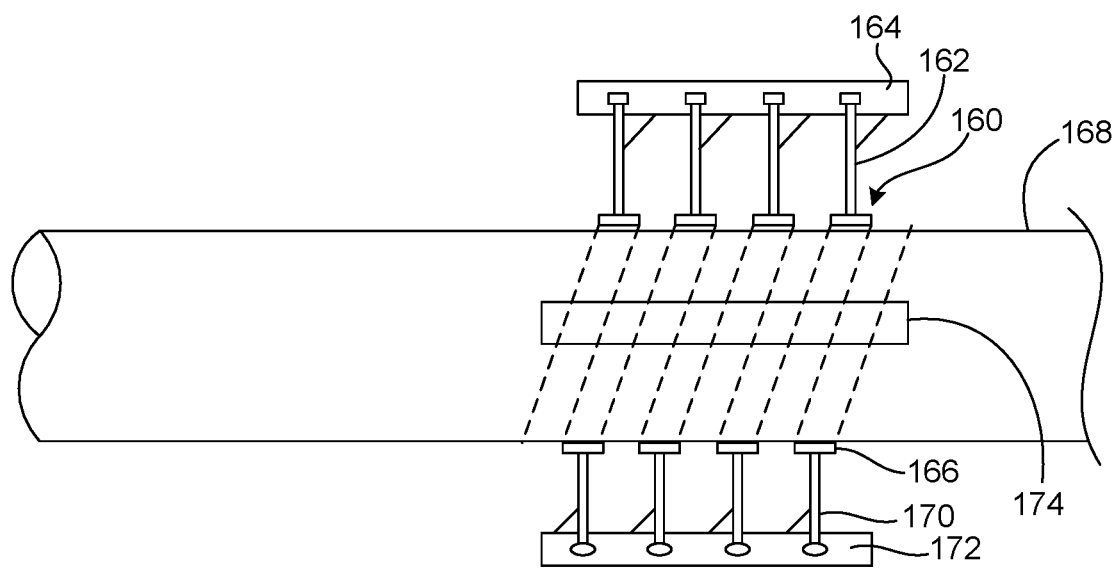
FIG. 8 is a plan view showing the longitudinal or oblique detection device of the present invention.

FIG. 8 shows the configuration of the present invention for smaller sizes of tubulars. It can be seen that there are detectors 160 that are connected to arms 162. Arms 162 are connected to a lift device 164. A second set of detectors 166 located on the opposite side of the tubular 168 from the detectors 160. Detectors 166 also are connected to arms 170 which, in turn, are connected to another lift device 172. The lift devices 164 and 166 can be suitably coordinated so as to open or close the detectors 160 and 166 upon the entry or exit of the tubular 168. The detectors 166 are offset from the detectors 160 (so as to cover the gap between the spaces between the detectors 160). As such, this will allow coverage of the areas between the rows of detectors located on the opposite sides of the tubular 168. The configuration of the detectors shown in FIG. 8 is suitable for the two rows of longitudinal or oblique single flux leakage sensors or multiple sensor type detectors. The magnet or electromagnet 174 will be positioned adjacent to the tubular 168 and offset by 90° from the detectors 160 and 166. The detectors 160 and 166 will be stationary as the tubular 168 helixes through the helixing conveyor.

Figure 9:
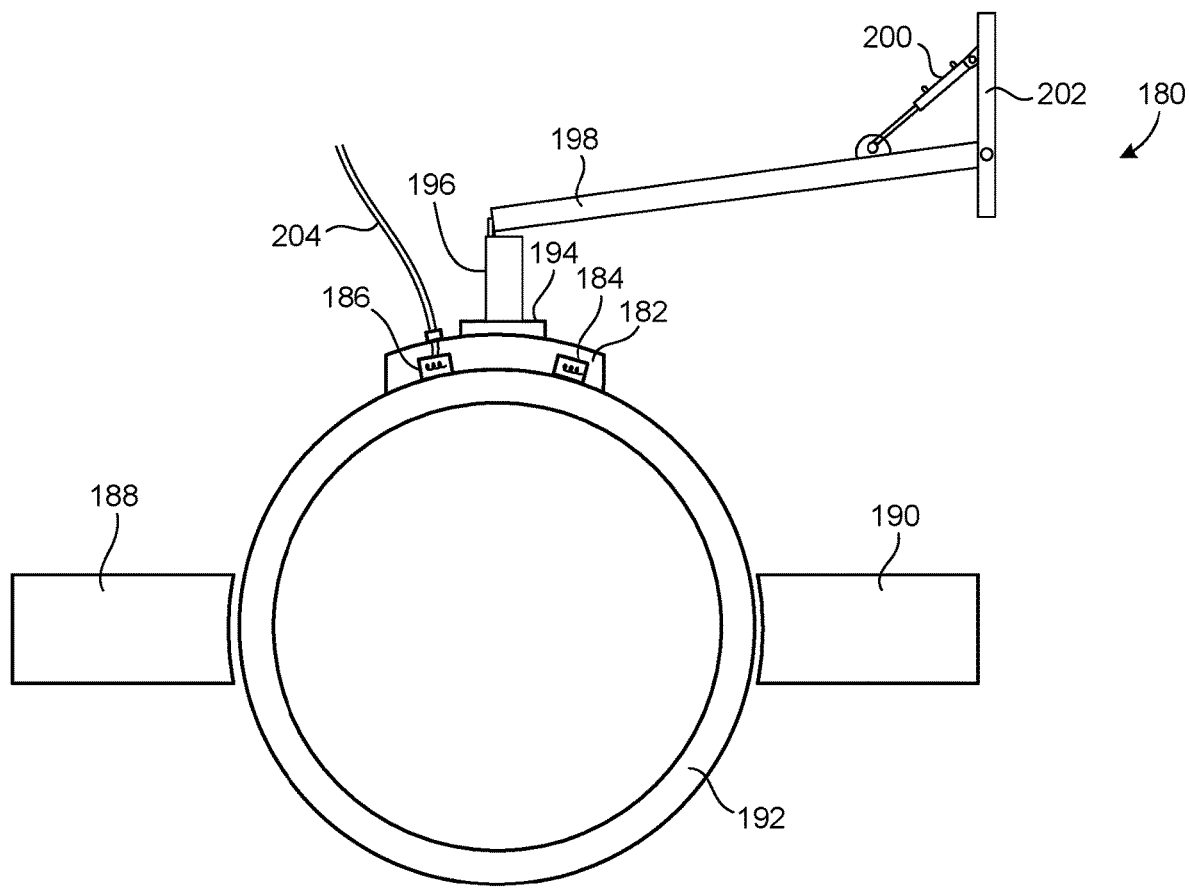
FIG. 9 is an end view of a pre-assembled multi-detector fixture for each size of tubular to be inspected.

FIG. 9 is an end view of a pre-assembled multi-detector fixture 180 of the present invention. This pre-assembled multi-detector fixture is of a type that can drop-in from the top of the inspection housing or slide-in from the side of the housing. The detector 182 can contain either one flux leakage detection sensor or two or more sensors in each detector. In particular, FIG. 9 shows that the detector 182 includes a pair of sensors 184 and 186 therein.

In FIG. 9, magnets 188 and 190 are located on opposite sides of the tubular 192. The detector housing 182 contains the second longitudinal or oblique flux sensor element. A mounting bracket 194 secures the detector housing 182 to arms 196 and 198. Arm 198 is a detector lift arm. An actuator cylinder 200 is pivotally connected to the arm 198 and is affixed to support 202. A signal cable 204 is connected to the sensor 186 so as to allow signals to be transmitted from the sensor. Sensors 184 and 186 can be longitudinal or oblique flux sensor elements.

Figure 10:
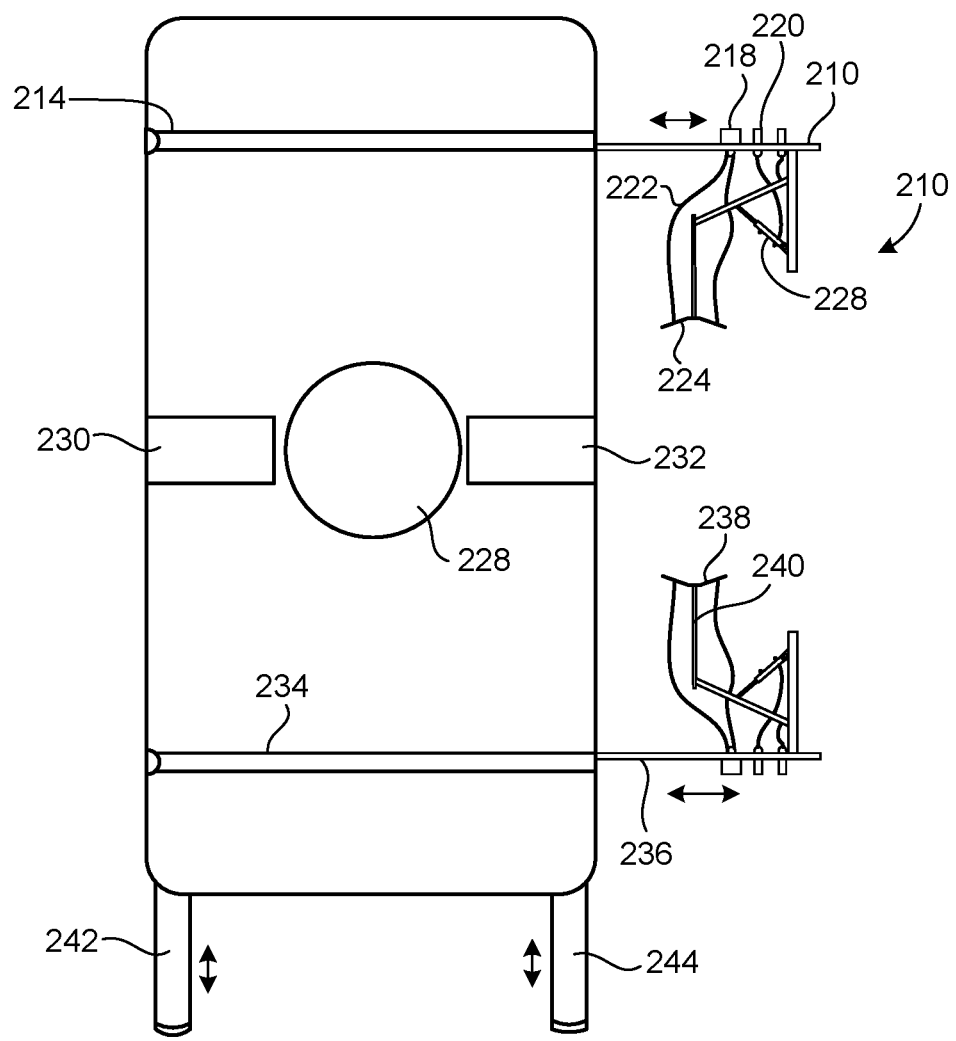
FIG. 10 is an end view of the longitudinal inspection frame with a pre-assembled multi-detector slide-in fixture.

FIG. 10 is an end view of the longitudinal inspection frame 210 having a pre-assembled multi-detector slide-in fixture. In particular, the frame 212 is a longitudinal frame having a channel guide 214. An arm 216 extends outwardly of the frame 212. A signal connector 218 is provided on the arm 216. Actuator connectors 220 are located on the arm 216. The signal connector 218 is connected by a line 222 to the detector 224. The actuator connectors 220 will be connected by lines to the actuator 226. Actuator 226 will be actuated so as to open or close the detector 224 relative to the tubular 228.

FIG. 10 shows that the magnets 230 and 232 are located on opposite sides of the tubular 228. There is another channel guide 234 located adjacent to the bottom of the frame 212. Arm 236 can be slidable in the direction of the arrow in FIG. 10. Once again, arm 236 will contain the signal connector and the actuator connectors thereon. The detector 238 is located at the end of the arm 240. The arm 240 can be suitably actuated so as to move the detector 238 between the open and closed position. Actuators 242 and 244 are located at the bottom of the frame 220 so as to allow for the raising or lowering of the frame 212, as desired.

Figure 11:
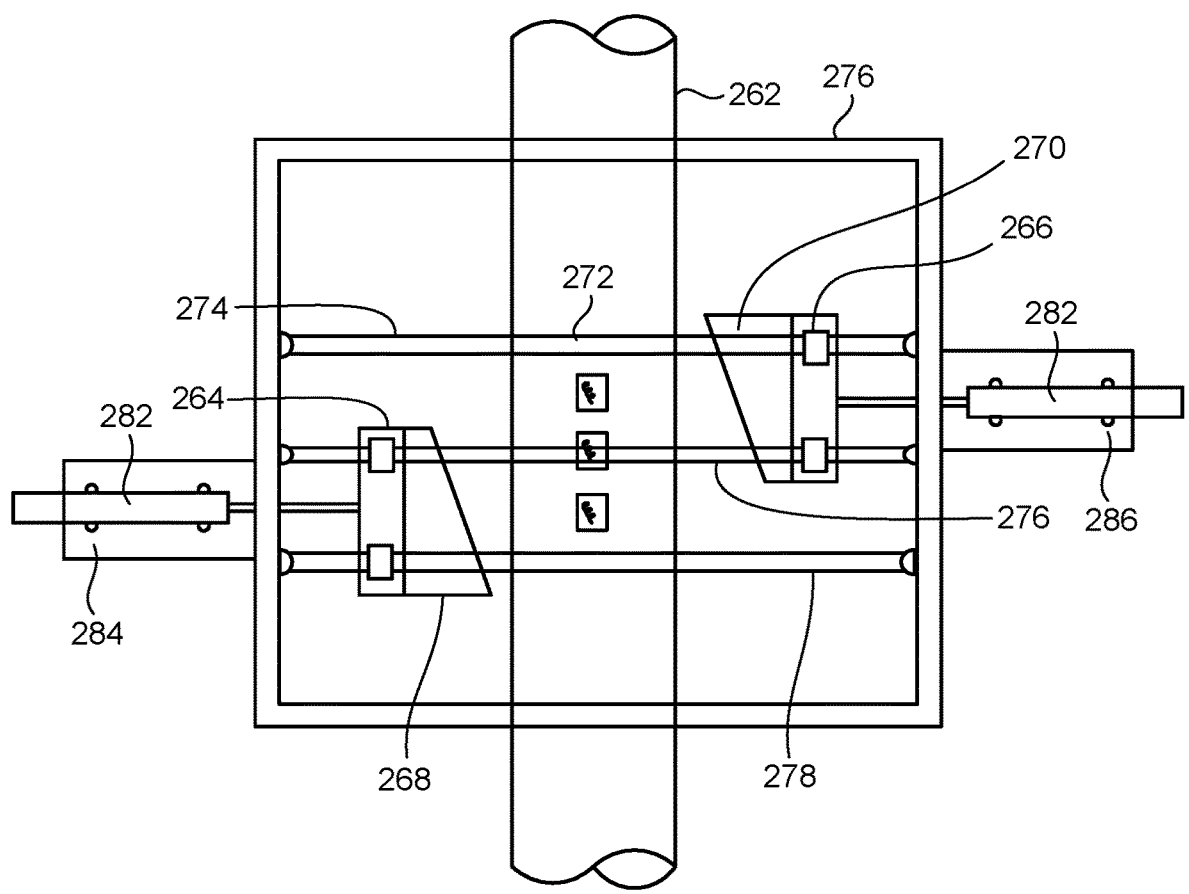
FIG. 11 illustrates the configuration of the oblique inspection device as used within the frame of the present invention.

FIG. 11 shows the oblique inspection assembly 260 of the present invention. In particular, the oblique inspection assembly is shown with the tubular 262 extending therethrough. Offset magnets 264 and 266 are spaced a distance away from the outer diameter of the tubular 262. Shims 268 and 270 are fastened to a face of the magnets 264 and 266, respectively, so as to be in close proximity to the tubular 262. Radiused detectors 272 are top-mounted. These radiused detectors have oblique sensors positioned at 90° to the oblique magnetic flux field. Bottom detectors, opposite to the radiused detectors 272, will be located below the tubular 262 (not shown).

A guide rod 274 extends across the interior of the housing 276 so as to provide support for the magnet 266. A common guide rod 276 is provided for each of the magnets 264 and 266. Guide rod 278 is provided for the magnet 264. Cylinders 280 and 282 are provided for the positioning of the respective magnets 264 and 266. Plates 284 and 286 allow for further adjustment of the cylinders 280 and 282, respectively.

Figure 12:
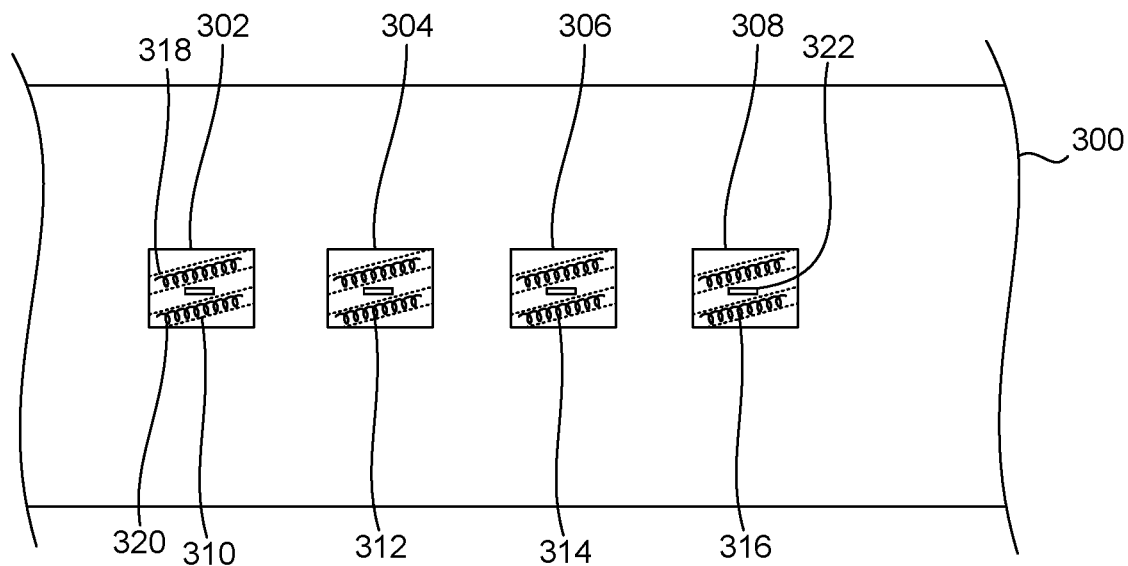
FIG. 12 is a top view of two or more obliquely-oriented flaw detection sensors as used in the electromagnetic detection system of the present invention.

FIG. 12 shows the arrangement of the obliquely-oriented flaw sensor elements with regard to the oblique flaw detection system of the present invention. In particular, in FIG. 12, it can be seen that there are housings 302, 304, 306 and 308 that contain oblique flaw sensors 310, 312, 314, and 316 therein. Oblique flaw sensor 310 includes a first sensor element 318 and a second sensor element 320 arranged at an oblique angle with respect to the tubular 300. The other oblique flaw sensors 312, 314 and 316 contain similar arrangements. Each of the housings 302, 304, 306 and 308 can be radially contoured to fit the outside diameter of the tubular. Mounting brackets 322 arranged so as to allow for X-Y movement. A similar arrangement of oblique flaw sensors will be located at the opposite side of the tubular 300.

Figure 13:
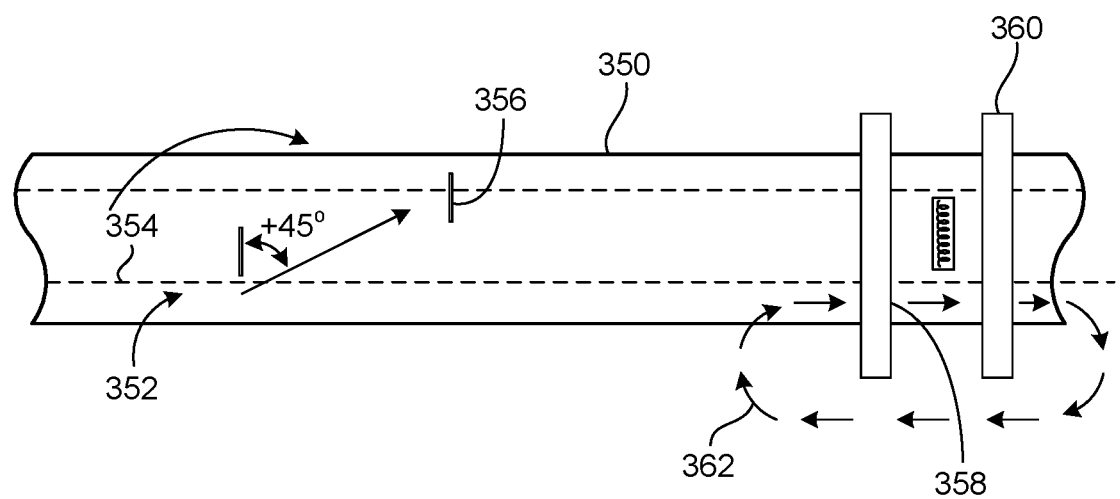
FIG. 13 is a plan view showing an alternative of the present invention as used when the helix angle of the helix conveyor exceeds 45° from the circumferential direction.

FIG. 13 shows the electromagnetic flaw detection system of the present invention in those circumstances where the helix angle of the helixing tubular exceeds 45° from the circumferential direction. In particular, FIG. 13 shows tubular 350 having wall 352 with an inner diameter 354. A helix angle of greater than 45° is illustrated in FIG. 13. A transverse two-dimensional flaw (i.e. crack) 356 is shown on the surface of the inner diameter 354 of the tubular 350. Another transverse two-dimensional flaw 358 is also shown on the surface of the outer diameter of the tubular 350. A transverse magnetic flux leakage detector 360 is illustrated as located between the two DC magnetizing coils 364 and 366. The two DC magnetizing coils 364 and 366 generate the magnetic flux field 362. Transverse detector 360 is only one of an array of transverse detectors encircling the surface of the outer diameter of the tubular 350. This transverse detector can also detect three-dimensional flaws, such as pits, corrosion, cuts, gouges, etc. There will be a total of eight such transverse detectors that are mounted within the transverse detector housing. As such, the two-dimensional and three-dimensional flaws will be suitably detected as the tubular 350 helixes along the helix conveyor. An alternative to the prior double coil magnetic flux transverse flaw detector is the transverse flaw detector (described in U.S. Pat. No. 5,431,054) that can be used for the detection of two-dimensional and three-dimensional transversely-oriented flaws.

The foregoing disclosure and description of the invention is illustrative and explanatory thereof. Various changes in the details of the illustrated construction can be made within the scope of the appended claims without departing from the true spirit of the invention. The present invention should only be limited by the following claims and their legal equivalents.

I claim:

1. A flaw detection apparatus for use with a tubular, the flaw detection apparatus comprising:
    a helixing conveyor adapted to receive the tubular thereon, said helixing conveyor having an entry section and an exit section and a center section positioned between the entry section and the exit section;
    a frame positioned over the center section of said helixing conveyor; and
    a plurality of inspection devices retained by said frame so as to detect flaws in the tubular as said helixing conveyor moves the tubular through said frame, said plurality of inspection devices comprising a grade comparator coil, said grade comparator coil positioned in the center section of said helixing conveyor.

2. The flaw detection apparatus of claim 1, said helixing conveyor having a plurality of sets of rollers, the plurality of sets of rollers be angularly adjustable relative to a longitudinal axis of said helixing conveyor.

3. The flaw detection apparatus of claim 2, each of said plurality of sets of rollers being supported by a base plate on said helixing conveyor, the base plate being connected to an actuator so as to move the plurality of sets of rollers between an orientation transverse to the longitudinal axis of said helix conveyor to a position angularly offset from the orientation transverse to the longitudinal axis of said helixing conveyor.

4. The flaw detection apparatus of claim 2, each of the plurality of sets of rollers being a V-roller.

5. The flaw detection apparatus of claim 1, said frame having a plurality of legs extending downwardly therefrom, said plurality of legs adapted to support said plurality of inspection devices above an underlying surface and adjacent to the tubular on said helixing conveyor.

6. The flaw detection apparatus of claim 5, each of said plurality of legs having a hydraulic or pneumatic actuator cooperative therewith so as to adjust a height of said frame.

7. A flaw detection apparatus for use with a tubular, the flaw detection apparatus comprising:
    a helixing conveyor adapted to receive the tubular thereon, said helixing conveyor having an entry section and an exit section and a center section positioned between the entry section and the exit section;
    a frame positioned over the center section of said helixing conveyor; and
    a plurality of inspection devices retained by said frame so as to detect flaws in the tubular as said helixing conveyor moves the tubular through said frame, said plurality of inspection devices comprising an oblique inspection device, said oblique inspection device comprising a pair of offset opposing magnets adapted to generate a magnetic flux field in a direction oblique to the tubular, and a row of sensor housings containing at least one sensor element oriented in a direction oblique to the tubular.

8. The flaw detection apparatus of claim 7, said pair of offset opposing magnets comprising:

a first pair of electromagnets positioned within said frame; and a second pair of electromagnets positioned in said frame opposite to said first pair of electromagnets, said first pair of electromagnets and said second pair of electromagnets arranged obliquely to a longitudinal axis of the tubular.

9. The flaw detection apparatus of claim 8, each electromagnet of said first and second pairs of electromagnets having a triangularly-shaped shim on a face thereof, the triangularly-shaped shim adapted to maintain the electromagnet in close proximity to an exterior surface of the tubular.

10. The flaw detection apparatus of claim 8, the at least one sensor element being oriented 90 degrees to an oblique magnetic flux generated by said second pair of electromagnets.

11. The flaw detection apparatus of claim 7, the at least one sensor element comprising at least a pair of sensor elements in each sensor housing of said row of sensor housings, each sensor housing of said row of sensor housings being contoured so as to fit an outer diameter of the tubular.

12. A flaw detection apparatus for use with a tubular, the flaw detection apparatus comprising:
   a helixing conveyor adapted to receive the tubular thereon, said helixing conveyor having an entry section and an exit section and a center section positioned between the entry section and the exit section;
   a frame positioned over the center section of said helixing conveyor; and
   a plurality of inspection devices retained by said frame so as to detect flaws in the tubular as said helixing conveyor moves the tubular through said frame, said plurality of inspection devices comprising a longitudinal inspection device, the longitudinal inspection device comprising:
      a housing received within said frame;
      at least two electromagnets positioned in said housing; and
      a row of longitudinal detectors positioned in said housing.

13. The flaw detection apparatus of claim 12, the longitudinal inspection device further comprising:
   a positioning detector positioned in said housing and adapted to scan a presence of a tubular entering the housing; and
   an actuator connected to said row of longitudinal detectors, said actuator connected to said positioning detector such that said actuator opens or closes said row of longitudinal detectors relative to a signal from said positioning detector.

14. The flaw detection apparatus of claim 12, said row of longitudinal detectors comprising at least two rows of longitudinal detectors, said housing positioned between the entry section and the exit section of said helixing conveyor.

* * * * *